(12) United States Patent
Lee (10) Patent No.: US 6,657,920 B2
(45) Date of Patent: Dec. 2, 2003

(54) CIRCUIT FOR GENERATING INTERNAL ADDRESS IN SEMICONDUCTOR MEMORY DEVICE

(75) Inventor: Jae Youl Lee, Chungcheongbuk-do (KR)

(73) Assignee: Hynix Semiconductor Inc., Ich'on (KR)

( * ) Notice: Subject to any disclaimer, the term of this patent is extended or adjusted under 35 U.S.C. 154(b) by 0 days.

(21) Appl. No.: 10/028,704

(22) Filed: Dec. 28, 2001

(65) Prior Publication Data

US 2003/0053366 A1 Mar. 20, 2003

(30) Foreign Application Priority Data

Sep. 20, 2001 (KR) ........................................ 2001-58148

(51) Int. Cl.⁷ ................................................ G11C 8/00
(52) U.S. Cl. ...................................... 365/236; 365/222
(58) Field of Search ................................. 365/222, 236, 365/225.7, 233.5, 233, 230.08, 230.06, 230.03; 377/119, 107

(56) References Cited

U.S. PATENT DOCUMENTS

| | | | |
|---|---|---|---|
| 4,873,671 A | * | 10/1989 | Kowshik et al. ........ 365/189.12 |
| 5,499,213 A | * | 3/1996 | Niimi et al. ................. 365/222 |
| 5,812,475 A | * | 9/1998 | Lee et al. .................... 365/222 |
| 6,141,279 A | * | 10/2000 | Hur et al. .................... 365/222 |
| 6,166,980 A | * | 12/2000 | Chun .......................... 365/222 |
| 6,208,547 B1 | | 3/2001 | Ooishi |
| 6,212,111 B1 | | 4/2001 | Wright et al. |
| 6,215,709 B1 | | 4/2001 | Wright et al. |
| 6,246,625 B1 | | 6/2001 | Yamagata et al. |
| 6,247,060 B1 | | 6/2001 | Boucher et al. |

FOREIGN PATENT DOCUMENTS

| | | | | |
|---|---|---|---|---|
| JP | 10-69768 | 3/1998 | ......... | G11C/11/406 |
| JP | 11-296441 | 10/1999 | ........... | G06F/12/16 |

* cited by examiner

*Primary Examiner*—David Nelms
*Assistant Examiner*—Gene N. Auduong
(74) *Attorney, Agent, or Firm*—Jacobson Holman PLLC (57) ABSTRACT

A circuit for generating an internal address in a semiconductor memory device which can reduce power consumption in a self-refresh operation, by generating an internal refresh address to refresh a partial array selected according to an external command includes: a counter unit having a plurality of binary counters for generating internal address signals for wholly or partially refreshing word lines of a bank according to a setup value of a memory; and a control unit for receiving a most significant signal and a second most significant signal of the counter unit, a first select signal and a second select signal for deciding a word line region of the bank to be activated, and a self-refresh signal and a refresh signal, and generating a signal for controlling the operation of the counter unit, a most significant internal address signal, and a second most significant internal address signal.

12 Claims, 11 Drawing Sheets

CIRCUIT FOR GENERATING INTERNAL ADDRESS IN SEMICONDUCTOR MEMORY DEVICE

BACKGROUND OF THE INVENTION

1. Field of the Invention

The present invention relates to a circuit for generating an internal address in a semiconductor memory device, and in particular to an improved circuit for generating an internal address in a semiconductor memory device which can reduce power consumption in a self-refresh operation, by generating an internal refresh address to refresh a partial array selected according to an external command.

2. Description of the Background Art

Figure 1:
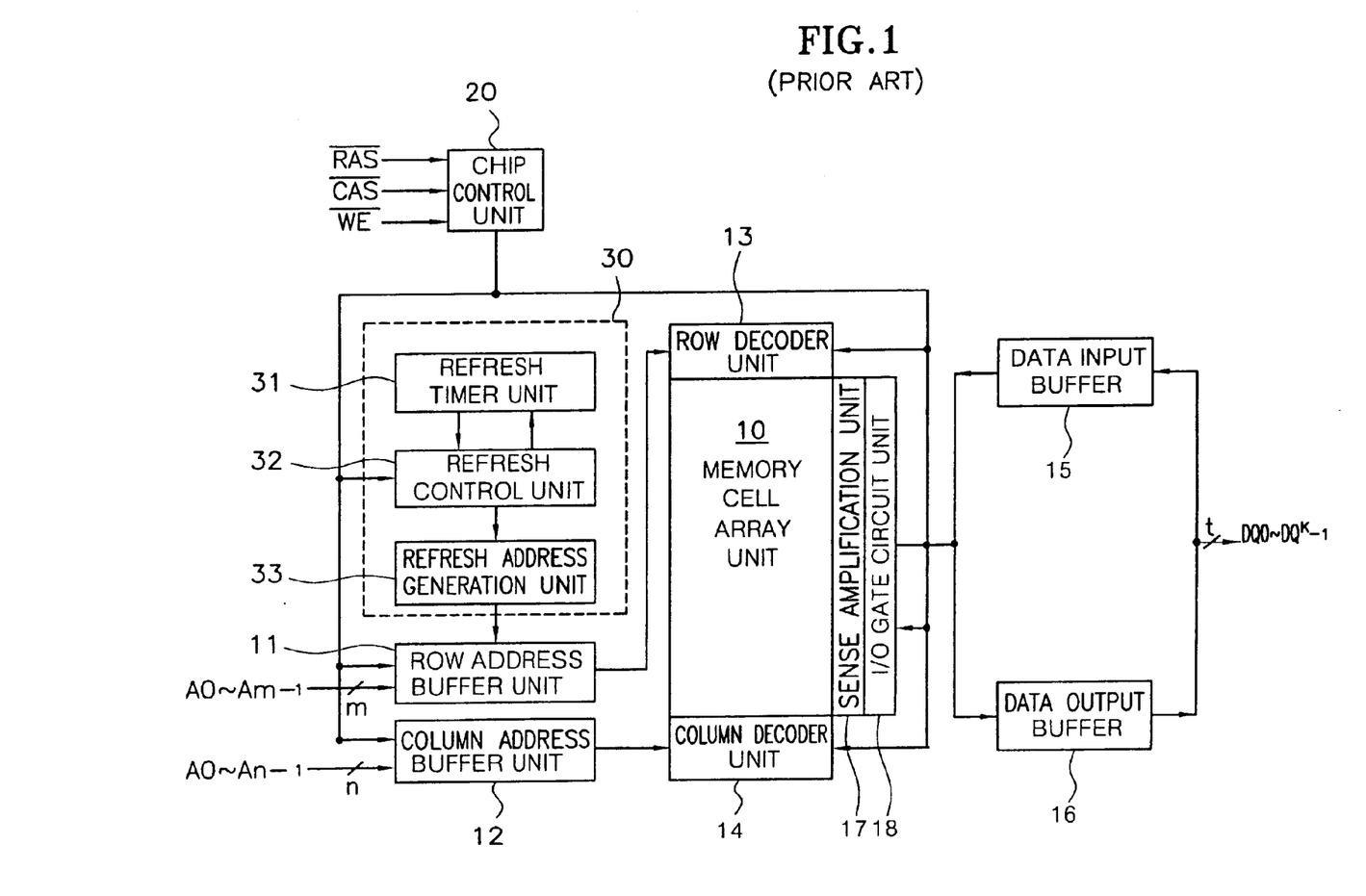
FIG. 1 is a block diagram illustrating a conventional DRAM.

The general constitution of the DRAM will now be explained with reference to FIG. 1 to provide background information on the technical field to which the present invention pertains. Referring to FIG. 1, the DRAM includes: a memory cell array unit 10 for storing data; a row address buffer unit 11 for receiving an m bit row address; a column address buffer unit 12 for receiving an n bit column address; a row decoder unit 13 for selecting a word line(s) of the memory cell array unit 10 according to the output signal from the row address buffer unit 11; a column decoder unit 14 for selecting a bit line(s) of the memory cell array unit 10 according to the output signal from the column address buffer unit 12; a data input buffer unit 15 for receiving data; and a data output buffer unit 16 for outputting data. In addition, the DRAM further includes: a sense amp unit 17 connected to the bit line(s) of the memory cell array, for reading a data signal(s) from a selected cell(s), and amplifying the data signal(s); an I/O gate circuit unit 18 for selectively connecting the bit line(s) of the memory cell array to the data input and output buffers 15 and 16 in response to the output signal(s) from the column decoder unit 14; and a chip control unit 20 for controlling the operation of peripheral circuits of the memory cell array unit 10.

As is well-known, one memory cell of the DRAM includes one select transistor and one data storage capacitor. Accordingly, the DRAM has been widely used as a semiconductor memory device for increasing the integration density on a semiconductor substrate.

However, since electric charges leak through the storage capacitor or select transistor, the DRAM needs to periodically perform a refresh operation to recharge the DRAM cells. As illustrated in FIG. 1, the DRAM further includes a refresh circuit unit 30 for controlling the data signals stored in the memory cells to be periodically amplified by the sense amp unit 17 and re-written on the memory cells, differently from the SRAM and non-volatile semiconductor memory device. The refresh circuit unit 30 includes: a refresh timer unit 31 for generating timing signal(s) for periodically performing the refresh operation; a refresh control unit 32 for controlling the whole operation relating to the refresh operation of the memory device according to the timing signal(s); and a refresh address generating unit 33 controlled by the refresh control unit 32, for generating internal refresh addresses.

A few methods for refreshing the DRAM cells have been widely employed. The main refresh methods will now be explained in brief.

In a RAS only refresh (ROR), while a column address strobe bar /CAS signal maintains a precharge level, a row address strobe bar /RAS signal is enabled to refresh cells. In the ROR, refresh addresses must be externally inputted to the memory device to perform the respective refresh operations, and address buses connected to the memory device cannot be used for other purposes during the refresh operations.

A CAS-before-RAS refresh (CBR) generates a row address in the refresh timer unit 31 built in the DRAM chip to perform the refresh operation, instead of externally inputting the refresh address.

In another refresh method, a hidden refresh is known as a combination of a read operation and a CBR operation. When /CAS is enabled at a low level in a read cycle, the output data maintains an effective state. Here, when /RAS reaches a high level and then returns to a low level, the CBR state is maintained, and thus one cycle of the CBR refresh is finished. The data output buffer unit 16 is controlled merely by /CAS, and thus the effective data are outputted in the whole cycle. Accordingly, it looks like a normal read operation. However, the refresh operation is executed by using an internal address generated by a CBR counter. That is why it is called a hidden refresh.

As described above, the ROR refresh, the CBR refresh and the hidden refresh are pulse refresh methods wherein a /RAS signal is externally inputted, and the refresh address is externally inputted or internally generated according to a control clock state. Recently, a /RAS signal which is a refresh synchronous signal has been used for other purposes such as reduction of power consumption in an operation mode generated in the DRAM or battery backup (BBU). That is, when the DRAM control signals satisfy a specific timing condition (the CBR mode is maintained over 100 $\mu$s, namely a self-refresh /RAS pulse width (tRASS) is over 100 $\mu$s), a refresh request signal is automatically generated by the refresh timer unit 31 without an external control signal, and thus RAS group control signals are automatically generated in the device, thereby performing the refresh operation according to the internally-generated address. This refresh operation is called a self-refresh operation.

The self-refresh mode is used to perform a low power operation or store data for an extended period of time. In the self-refresh mode, all of the input pins including the clock but excluding a clock enable pin cke are inactivated, not only the refresh address but also a refresh entry command are internally generated, and thus a generation period thereof is increased to reduce power consumption.

When the whole bank remains in an idle state, a chip selection signal /CS, a RAS bar signal /RAS, a CAS bar signal /CAS and a clock enable signal CKE reach a low level, and a write enable signal /WE reaches a high level, thereby entering the self-refresh mode. Once the self-refresh mode is started, all the input pins except for the clock enable pin cke are ignored.

In order to terminate the self-refresh mode, the clock buffer should be normalized by normally inputting a clock, and transforming the clock enable signal CKE to a high level. The SDRAM has an idle state after an active to active command delay time tRC. Here, it is possible to input a different command.

In general, the time interval for refreshing all the rows of the cell array, namely the time length between the refresh operation of the row of the memory cell array and the succeeding refresh operation thereof is called a refresh period. For example, in the case of the 16 megabit DRAM having a cell array constituted of 2048 rows×512 columns× 16 bits and performing 2K(=2048) refresh cycles in a period, when a maximum time interval (namely, the refresh period) for refreshing 512 memory cells connected to one row is 128 ms, it is necessary to sequentially refresh 2048 rows in the time interval. Here, an inter-cycle time interval, namely a refresh clock period, is about 62.5 μs (=128 ms÷2048 rows), and one refresh cycle (for example, 80 to 200 ns) is performed in every time interval, 62.5 μs.

Figure 2:
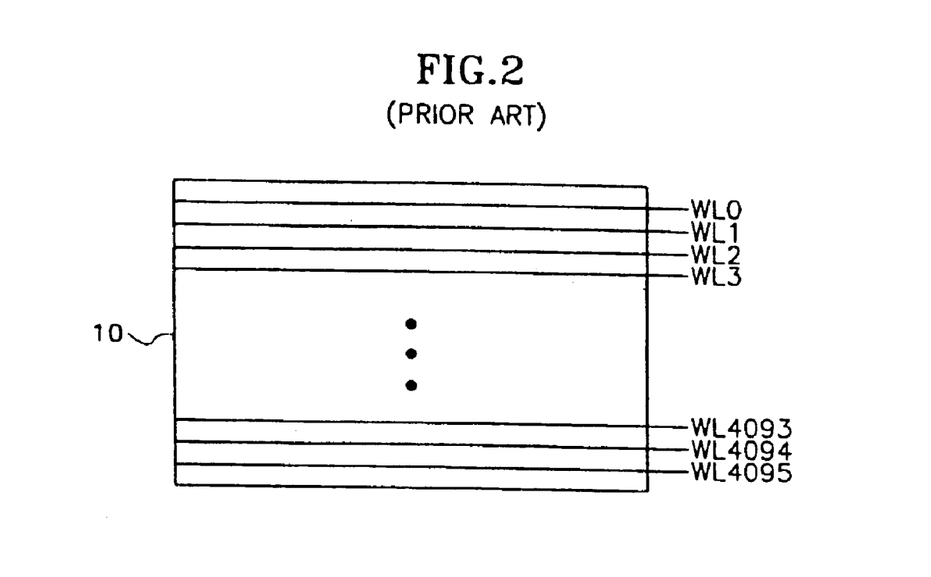
FIG. 2 is an explanatory diagram illustrating the self-refresh order of the conventional 128M DRAM.

FIG. 2 is an explanatory diagram illustrating a self-refresh order in a conventional 128M DRAM. As shown in FIG. 2, 4096 word lines WL0–WL4095 exist in one bank 10 of the 128M DRAM. The time for self-refreshing all the word lines WL0–WL4095 is 64 ms, and thus one word line is refreshed every 15.6 μs. Accordingly, a consumption current It is represented by the following formula:

$$It=4096\times Iref+Istb$$

Here, It represents a consumption current for 64 ms, Iref represents a consumption current for refreshing one word line, and Istb represents a consumption current continuously consumed by the memory circuit in the self-refresh mode.

Figure 3:
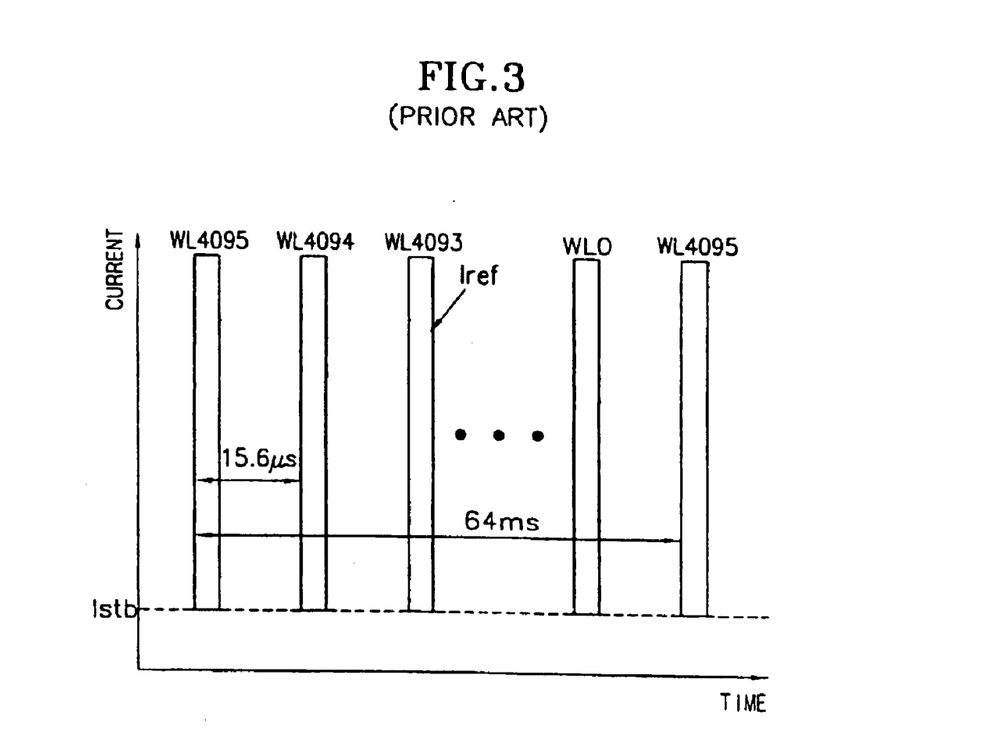
FIG. 3 is a graph plotting the consumption current against time in a self-refresh mode.

FIG. 3 is a graph plotting the consumption current against time in the self-refresh mode.

Figure 4:
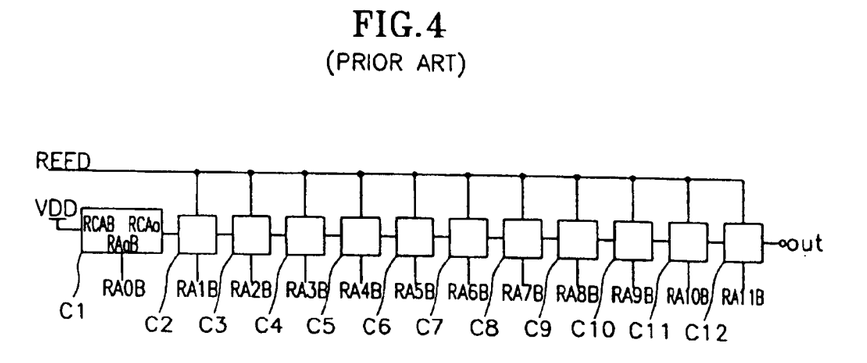
FIG. 4 is a circuit diagram illustrating a conventional circuit for generating an internal address.

FIG. 4 is a circuit diagram illustrating a conventional circuit for generating an internal address. Here, 12 binary counters C1–C12 are used to refresh 4096 word lines WL0–WL4095.

The 4096 word lines should be refreshed once every 64 ms regardless of their order. Therefore, word lines 0 to 4096 are designated by using the binary counters C1–C12 having addresses 0 to 22.

Figure 5:
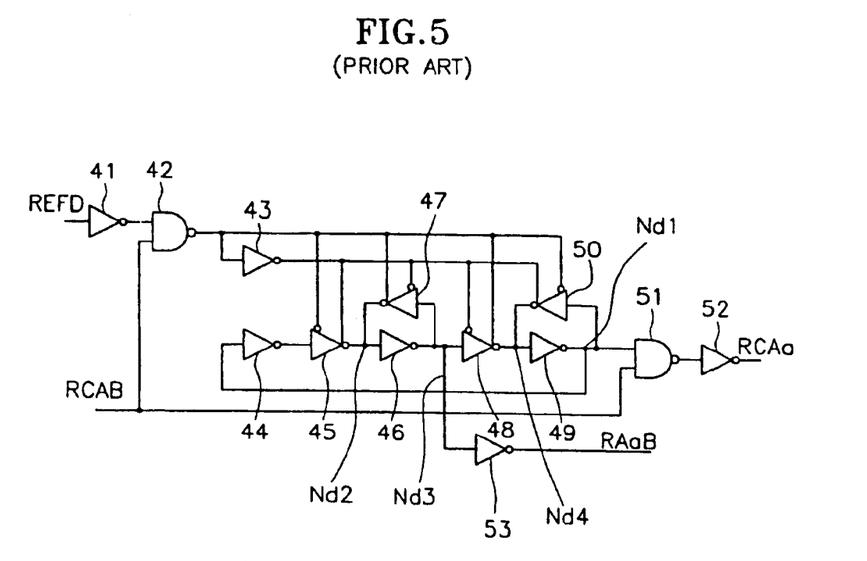
FIG. 5 is a circuit diagram illustrating a binary counter making up a conventional circuit for generating an internal address.

FIG. 5 is a circuit diagram illustrating one of the binary counters C1–C12 composing the conventional circuit for generating the internal address. As depicted in FIG. 5, each binary counter includes: an inverter 41 for receiving a refresh signal REFD; a NAND gate 42 for receiving the output signal from the inverter 41 and an input signal RCAB; an inverter 43 for receiving the output signal from the NAND gate 42; an inverter 44 for receiving a signal of a node Nd1; a clock inverter 45 for receiving the output signal from the inverter 44, inverting the signal according to the output signal from the NAND gate 42 and the output signal from the inverter 43, and outputting the inverted signal to a node Nd2; an inverter 46 for receiving the signal of the node Nd2, and outputting the inverted signal to a node Nd3; a clock inverter 47 for receiving the signal of the node Nd3, inverting the signal according to the output signal from the NAND gate 42 and the output signal from the inverter 43, and outputting the inverted signal to the node Nd2; a clock inverter 48 for receiving the signal of the node Nd3, inverting the signal according to the output signal from the NAND gate 42 and the output signal from the inverter 43, and outputting the inverted signal to a node Nd4; an inverter 49 for receiving the signal of the node Nd4, and outputting the inverted signal to the node Nd1; a clock inverter 50 for receiving the signal of the node Nd1, inverting the signal according to the output signal from the NAND gate 42 and the output signal from the inverter 43, and outputting the inverted signal to the node Nd4; a NAND gate 51 for receiving the signal of the node Nd1 and the input signal RCAB; an inverter 52 for receiving the output signal from the NAND gate 51, and outputting the inverted signal RCAa; and an inverter 53 for receiving the signal of the node Nd3, and outputting the inverted signal RAaB.

When the refresh signal REFD has a high level, the binary counter circuit latches the signal of the node Nd3 with the clock inverter 47 and the inverter 46. The latched signal of the node Nd3 is inputted to the NAND gate 51 through the clock inverter 48 and the inverter 49. When the refresh signal REFD has a low level and the input signal RCAB has a high level, the signal of the node Nd1 is inverted through the inverter 44, the clock inverter 45 and the inverter 46, and the inverted signal is transmitted to the node Nd3. In addition, the signal of the node Nd1 is latched by the clock inverter 50 and the inverter 49. The signal of the node Nd3 which is the output signal from the inverter 46 is outputted as the output signal RAaB of the binary counter circuit through the inverter 53.

Figure 6:
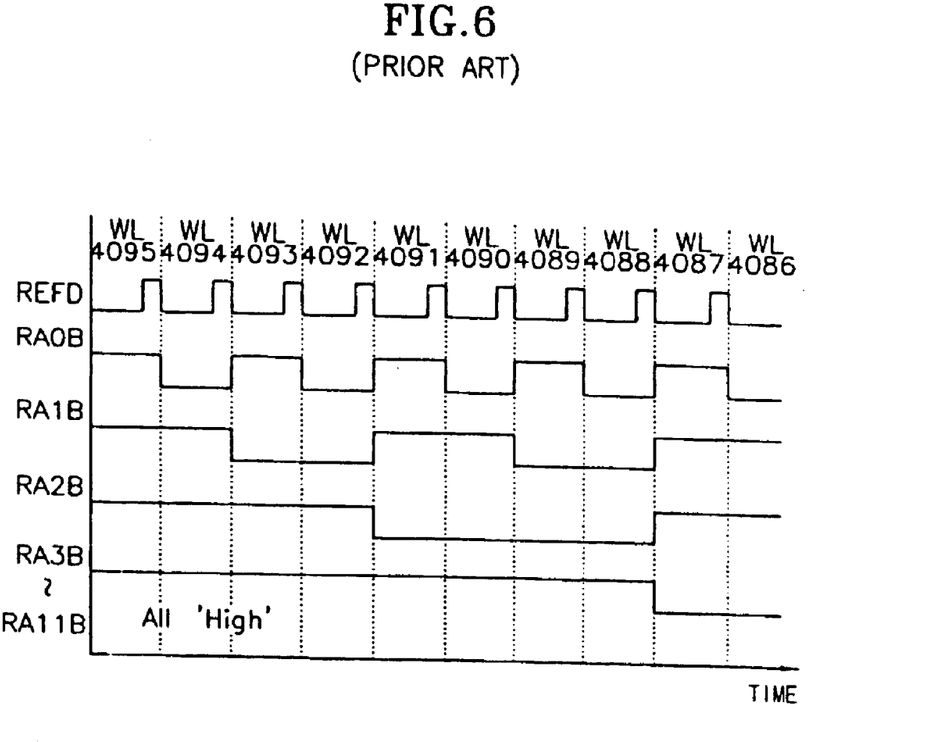
FIG. 6 is a waveform diagram illustrating outputs from the conventional circuit for generating the internal address.

FIG. 6 is a waveform diagram illustrating outputs from the conventional circuit for generating the internal address.

As illustrated in FIG. 6, whenever the refresh signal REFD falls from a high to a low level, the binary counter circuit reduces one output signal RAaB, thereby sequentially selecting the 4096 word lines.

However, the low power DRAM does not refresh whole-word lines of the bank, but selectively refreshes partial word lines. Here, the conventional circuit for generating the internal address in the semiconductor memory device cannot sequentially generate only the addresses of the word lines in a predetermined region.

SUMMARY OF THE INVENTION

Accordingly, it is an object of the present invention to provide a circuit for generating an internal address which can reduce power consumption in a self-refresh operation, by generating an internal refresh address to refresh a partial array selected according to an external command.

In order to achieve the above-described object of the invention, there is provided a circuit for generating an internal address in a semiconductor memory device, including: a counter unit having a plurality of binary counters for generating internal address signals for wholly or partially refreshing word lines of a bank according to a setup value of a memory; and a control unit for receiving a most significant signal and a second most significant signal of the counter unit, a first select signal and a second select signal for deciding a word line region of the bank to be activated, and a self-refresh signal and a refresh signal, and generating a signal for controlling the operation of the counter unit, a most significant internal address signal, and a second most significant internal address signal, so that the output from the binary counters can be synchronized with the refresh signal and toggled, or fixed at a low level according to the received signals.

The counter unit includes: an M-th counter unit for receiving the refresh signal, the control signal from the control unit and a power voltage, and generating the sequentially-increased most significant internal address signal and a counter output signal; an M-1th counter unit for receiving the refresh signal, the control signal from the control unit, and the counter output signal from the 12th counter unit, and generating the second most significant internal address signal and a counter output signal; and first to M-2th counter units for respectively receiving the refresh signal and the counter output signal from preceding binary counter units, and generating the internal address signal and counter output signal.

The M-1th and M-th counter units are binary counters for sequentially increasing output signals.

The first to M-2th binary counter units are binary counters for sequentially decreasing output signals.

The period of the refresh signal is greater by a factor of 2N when the address output signals of the first to M-th counter units are fixed at a low level than when the address output signals of the first to M-th counter units are not fixed at a low level (N is the number of address output signals fixed at a low level).

The first select signal is a signal for selecting a self-refresh of a half region of the bank.

The second select signal is a signal for selecting a self-refresh of a quarter region of the bank.

BRIEF DESCRIPTION OF THE DRAWINGS

The present invention will become better understood with reference to the accompanying drawings which are given only by way of illustration and thus are not limitative of the present invention, wherein.

DETAILED DESCRIPTION OF THE PREFERRED EMBODIMENTS

A circuit for generating an internal address in a semiconductor memory device in accordance with a preferred embodiment of the present invention will now be described in detail with reference to the accompanying drawings.

In the following description, the same drawing reference numerals are used for the same elements even in different drawings, and explanations thereof will be omitted.

Figure 7:
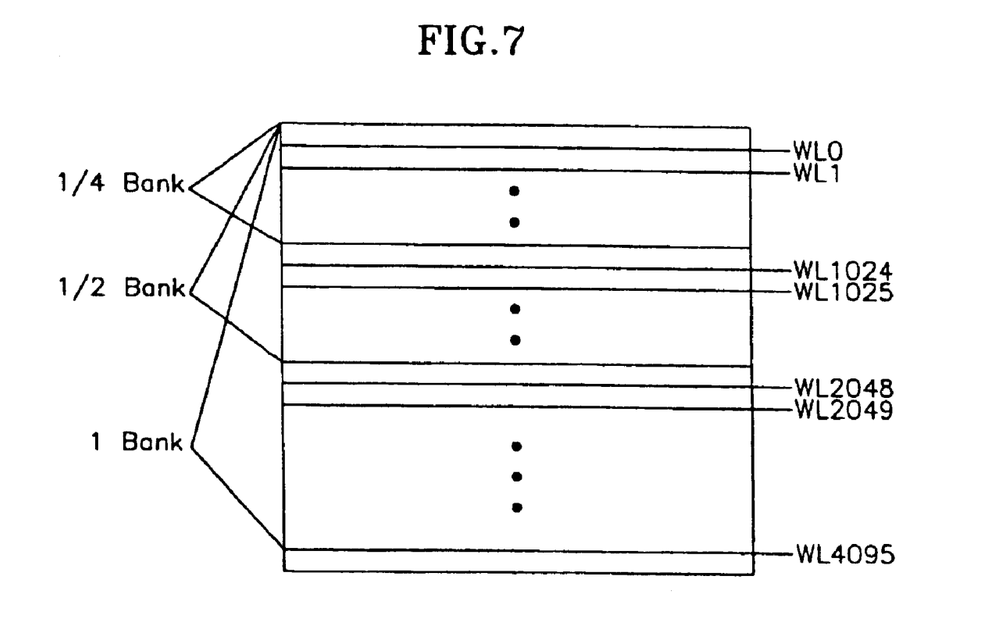
FIG. 7 is an explanatory diagram illustrating a select region self-refreshed in a low power 128M DRAM in accordance with the present invention.

FIG. 7 is an explanatory diagram illustrating a select region self-refreshed in a low power 128M DRAM in accordance with the present invention. In the 128M DRAM, each bank 10 includes 4096 word lines WL0–WL4095.

In FIG. 7, the whole bank (word lines 0 to 4095), half a bank (word lines 0 to 2047) or a quarter bank (word lines 0 to 1023) can be self-refreshed according to a setup value.

For example, when the quarter bank is set up in the memory, 1024 word lines 0–1023 should be refreshed at least once every 64 ms, thus increasing the refresh interval to 62.4 µs. Therefore, a consumption current It of the self-refresh operation is represented by the following formula:

$$It = 1024 \times Iref + Istb$$

Here, It represents a consumption current for 64 ms, Iref represents a consumption current for refreshing one word line, and Istb represents a consumption current continuously consumed by the memory circuit in the self-refresh mode.

Accordingly, the present invention reduces the consumption current more than the DRAM which does not support the partial array self-refresh by 3072×Iref.

Figure 8:
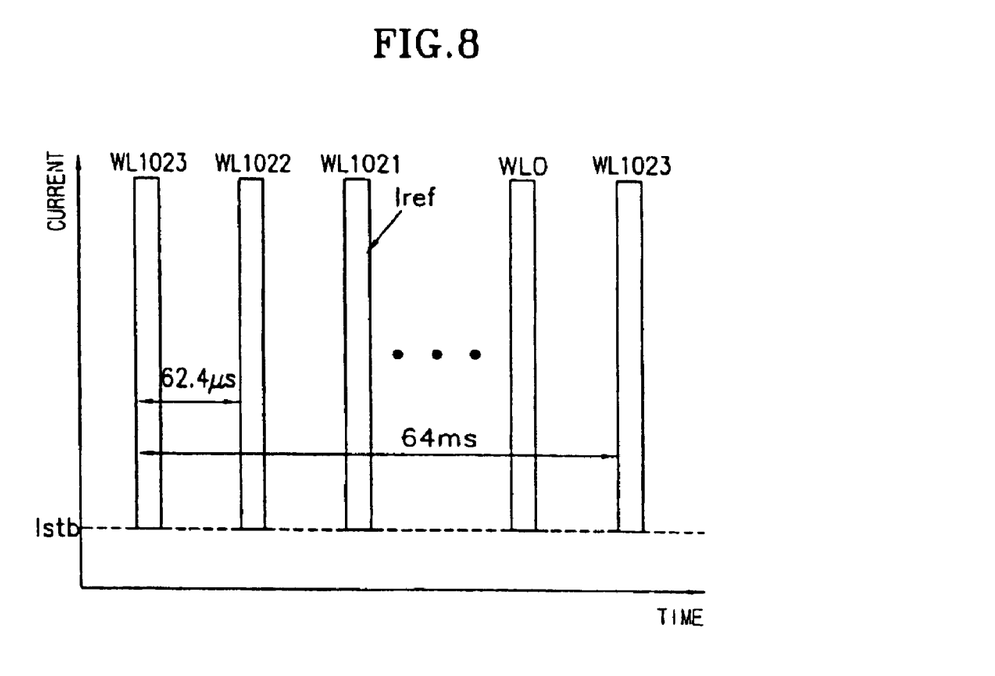
FIG. 8 is a graph plotting the consumption current against time in a quarter bank refresh mode in accordance with the present invention.

FIG. 8 is a graph plotting the consumption current against time in the self-refresh mode in accordance with the present invention. Referring to FIG. 8, when the quarter bank is set up in the memory, the refresh time of the 1024 word lines 0–1023 is 64 ms, and the refresh time of one word line is 62.4 µs. That is, the refresh time of one word line is greater than in the conventional art (15.6 µs).

Figure 9:
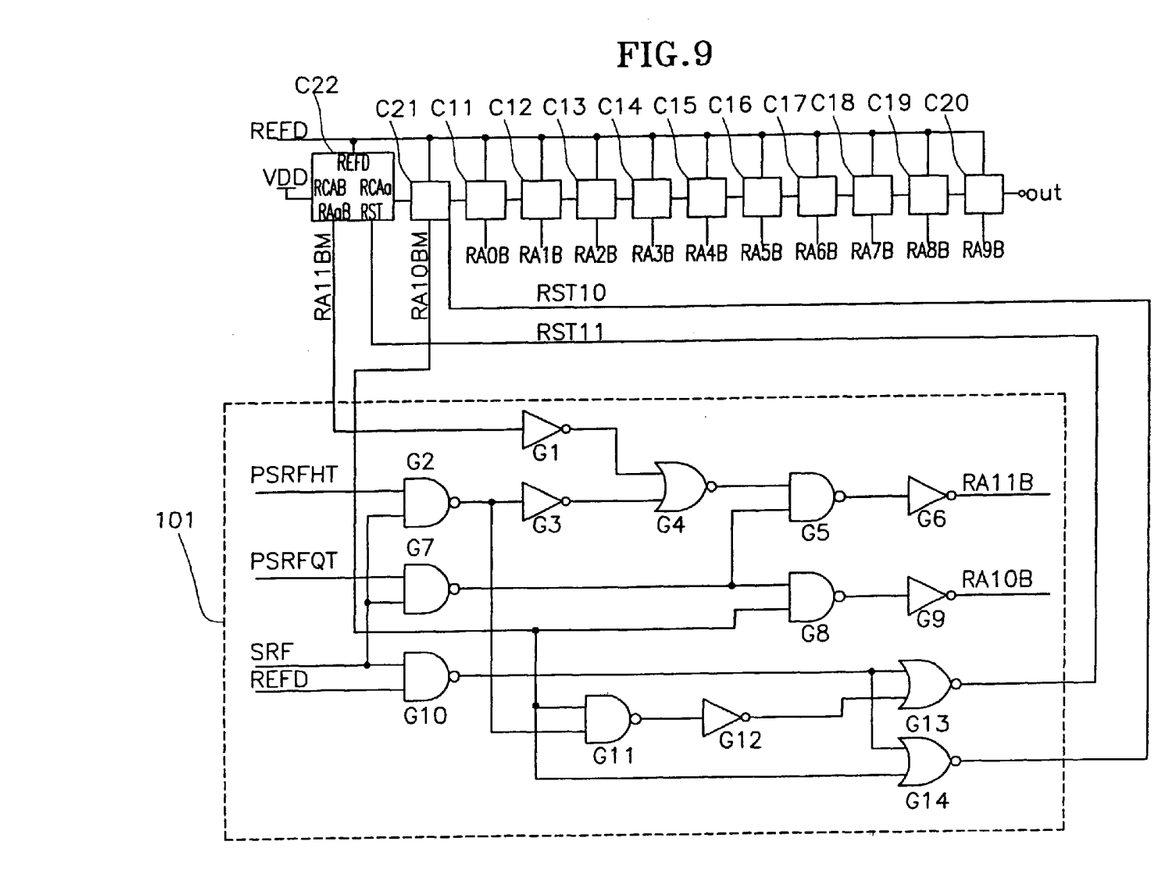
FIG. 9 is a circuit diagram illustrating a circuit for generating an internal address in accordance with the present invention.

FIG. 9 is a circuit diagram illustrating a circuit for generating the internal address in accordance with the present invention. The circuit for generating the internal address includes first to 12th binary counter units C11–C22 and a control unit 101 for generating internal addresses for wholly or partially refreshing the word lines WL0–WL4095 of the bank according to the setup value of the memory, synchronizing at least one most significant address output signal with a refresh signal according to the state of the input signals, and sequentially toggling the output signals, or fixing the output signals at a low level.

The 12th binary counter unit C22 receives a refresh signal REFD, a refresh setting signal RST from the control unit 101, and a power voltage VDD as an input signal RCAB, and generates a sequentially-increased most significant internal address signal RAaB and a counter output signal RCAa.

The 11th binary counter unit C21 receives the refresh signal REFD, the refresh setting signal RST from the control unit 101, and the counter output signal RCAa from the 12th binary counter unit C22 as an input signal RCAB, and generates an 11th internal address signal RAaB and a counter output signal RCAa.

The 11th and 12th binary counter units C21 and C22 are binary counters for generating a 12th address signal RA11B which is the most significant address and an 11th address signal RA10B, and sequentially increasing the output signals.

The first to 10th binary counters C11–C20 respectively receive the refresh signal REFD and the counter output signal RCAa from the preceding binary counter units as an input signal RCAB, and generate the internal address signal RAaB and the counter output signal RCAa.

The first to 10th binary counters C11–C20 are binary counters for generating a first address signal RA0B which is the least significant address signal and a 10th address signal RA9B, and sequentially decreasing the output signals.

The first to 12th binary counter units C11–C22 synchronize at least one most significant address output signal with the refresh signal REFD according to the state of the input signals, and sequentially toggle the output signals, or fix the output signals at a low level. Here, the period of the refresh signal REFD is greater by a factor of 2N when the output signals from the first to 12th binary counter units C11–C22 are fixed at a low level than when the output signals thereof are not fixed at a low level. N denotes the number of the output signals fixed at a low level.

In addition, when the output signal RA11BM from the 12th binary counter unit C22 and the output signal RA10BM from the 11th binary counter unit C21 are inputted and the half bank self-refresh is set up, if a control signal PSRFHT having a high signal is inputted and the quarter bank self-refresh is set up, the control unit 101 receives a control signal PSRFQT having a high signal, a self-refresh operation signal SRF and the refresh operation signal REFD, generates refresh setting signals RST11 and RST10 to the 12th and 11th binary counter units C22 and C21, respectively, and also generates the 12th internal address signals RA11B and RA10B.

The control unit 101 includes: a NAND gate G2 for receiving the control signal PSRFHT and the self-refresh operation signal SRF; an inverter G3 for receiving the output signal from the NAND gate G2; an inverter G1 for receiving the output signal RA11BM from the 12th binary counter unit C22; a NOR gate G4 for receiving the output signals from the inverters G1 and G3; a NAND gate G7 for receiving the control signal PSRFQT and the self-refresh operation signal SRF; a NAND gate G5 for receiving the output signal from the NOR gate G4 and the output signal from the NAND gate G7; an inverter G6 for receiving the output signal from the NAND gate G5, and outputting the internal address signal RA11B; a NAND gate G8 for receiving the output signal from the NAND gate G7 and the output signal from the 11th binary counter unit C21; an inverter G9 for receiving the output signal from the NAND gate G8, and generating the internal address signal RA10B; a NAND gate G10 for receiving the self-refresh operation signal SRF and the refresh signal REFD; a NAND gate G11 for receiving the output signal RA10BM from the 11th binary counter unit C21 and the output signal from the NAND gate G2; an inverter G12 for receiving the output signal from the NAND gate G11; a NOR gate G13 for receiving the output signal from the NAND gate G10 and the output signal from the inverter G12, and generating the refresh setting signal RST11 to the 12th binary counter unit C22; and a NOR gate G14 for receiving the output signal from the NAND gate G10 and the output signal RA10BM from the 11th binary counter unit C21, and generating the refresh setting signal RST10 to the 11th binary counter unit C21.

Figure 10:
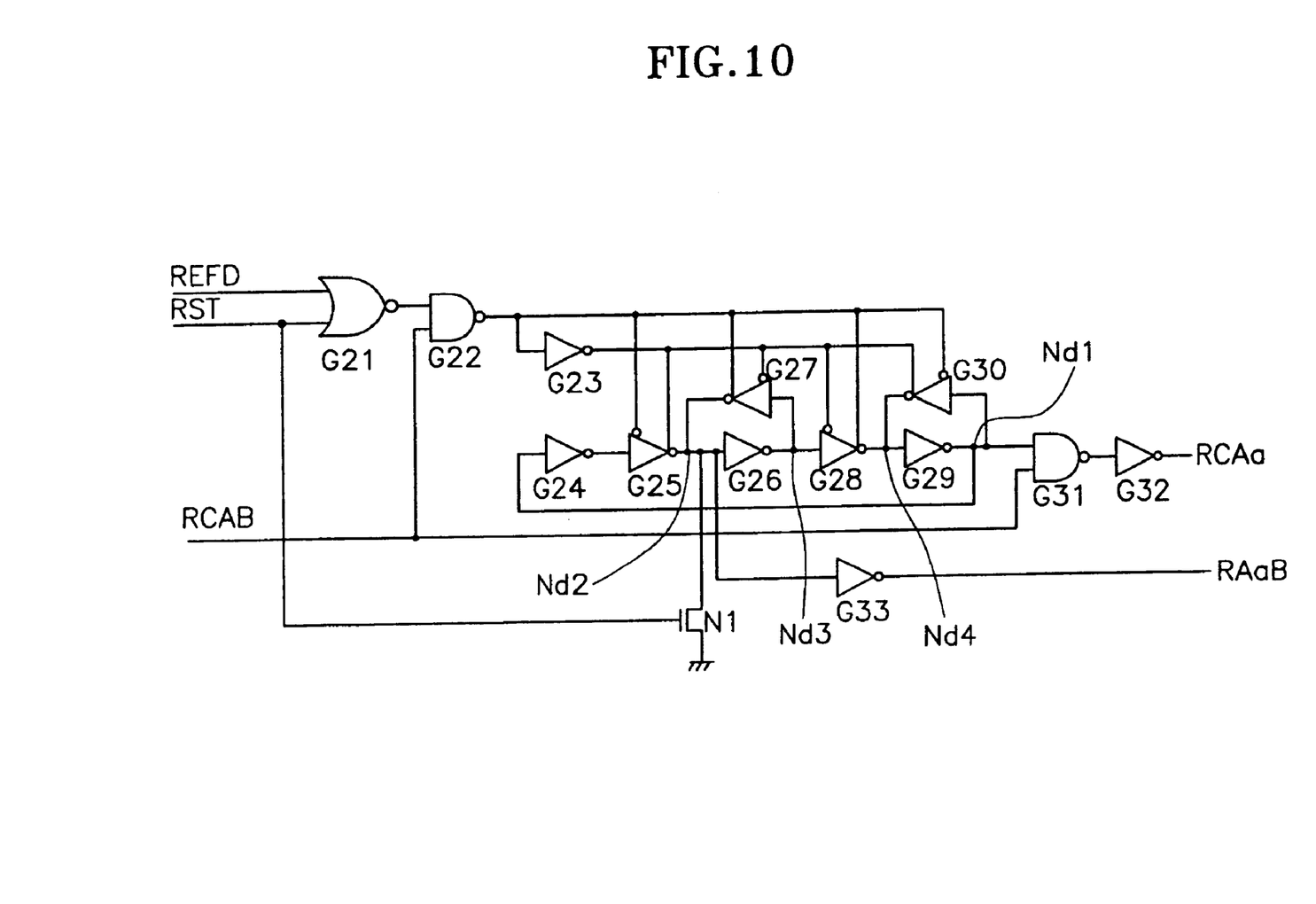
FIG. 10 is a circuit diagram illustrating 11th and 12th binary counter units of FIG. 9.

FIG. 10 is a circuit diagram illustrating the 11th and 12th binary counter units C21 and C22. The 11th and 12th binary counter units C21 and C22 include: a NOR gate G21 for receiving the refresh signal REFD and the refresh setting signal RST from the control unit 101; a NAND gate G22 for receiving the output signal from the NOR gate G21 and the input signal RCAB; an inverter G23 for receiving the output signal from the NAND gate G22; an inverter G24 for receiving the signal of a node Nd1; a clock inverter G25 for receiving the output signal from the inverter G24, inverting the signal according to the output signal from the NAND gate G22 and the output signal from the inverter G23, and outputting the inverted signal to a node Nd2; an inverter G26 for receiving the signal of the node Nd2, and outputting the inverted signal to a node Nd3; a clock inverter G27 for receiving the signal of the node Nd3, inverting the signal according to the output signal from the NAND gate G22 and the output signal from the inverter G23, and outputting the inverted signal to the node Nd2; a clock inverter G28 for receiving the signal of the node Nd3, inverting the signal according to the output signal from the NAND gate G22 and the output signal from the inverter G23, and outputting the inverted signal to a node Nd4; an inverter G29 for receiving the signal of the node Nd4, and outputting the inverted signal to the node Nd1; a clock inverter G30 for receiving the signal of the node Nd1, inverting the signal according to the output signal from the NAND gate G22 and the output signal from the inverter G23, and outputting the inverted signal to the node Nd4; a NAND gate G31 for receiving the signal of the node Nd1 and the input signal RCAB; an inverter G32 for receiving the output signal from the NAND gate G31, and outputting the inverted signal RCAa; an inverter G33 for receiving the signal of the node Nd2, and outputting the inverted signal RAaB; and an NMOS transistor N1 for discharging the signal of the node Nd2 to a ground voltage Vss according to the refresh setting signal RST.

Figure 11:
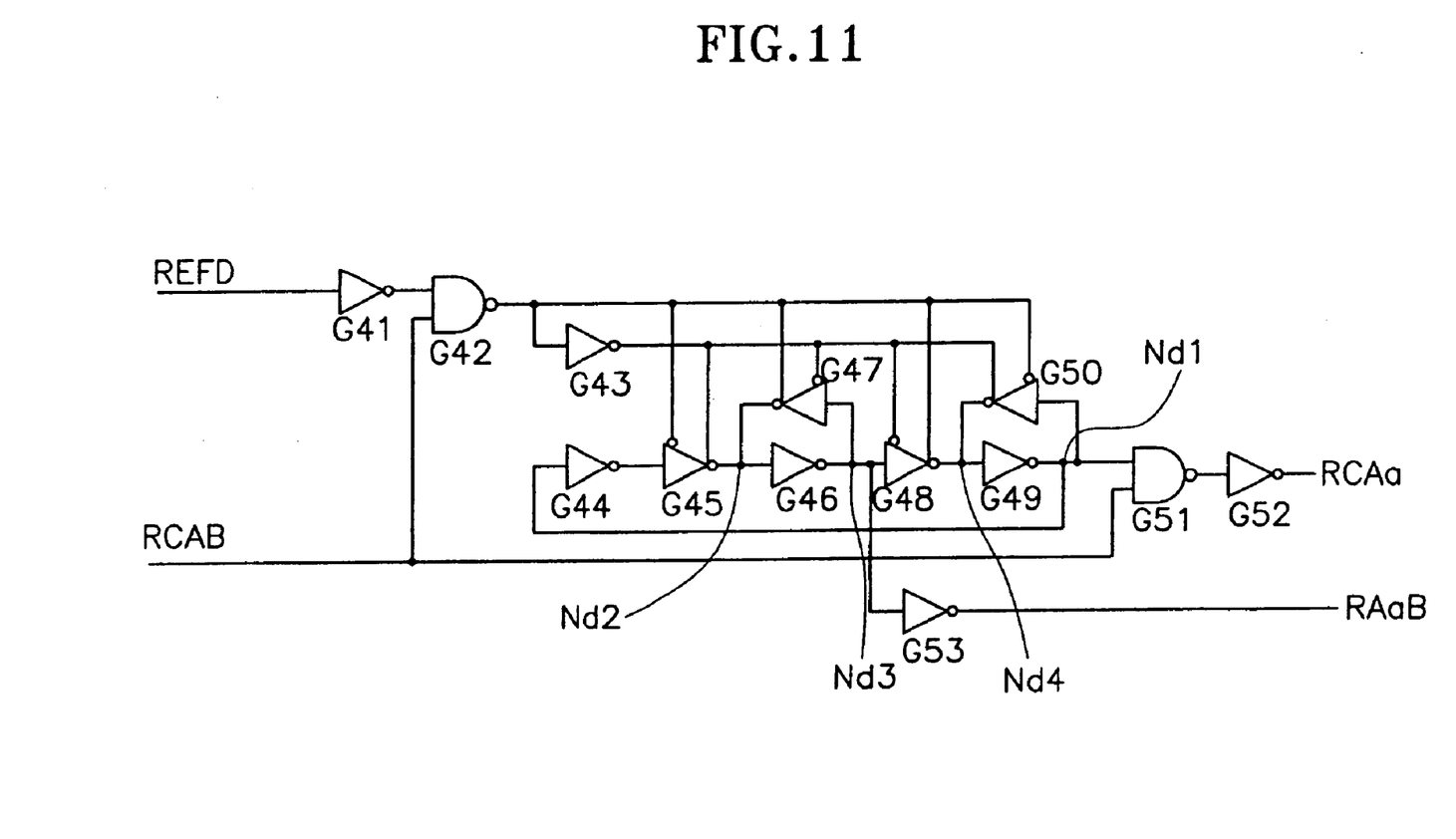
FIG. 11 is a circuit diagram illustrating first to 10th binary counter units of FIG. 9.

FIG. 11 is a circuit diagram illustrating the first to 10th binary counter units C11–C20. The first to 10th binary counter units C11–C20 include: an inverter G41 for receiving the refresh signal REFD; a NAND gate G42 for receiving the output signal from the inverter G41 and the output signal RCAa from the preceding binary counter unit as an input signal RCAB; an inverter G43 for receiving the output signal from the NAND gate G42; an inverter G44 for receiving a signal of a node Nd1; a clock inverter G45 for receiving the output signal from the inverter G44, inverting the signal according to the output signal from the NAND gate G42 and the output signal from the inverter G43, and outputting the inverted signal to a node Nd2; an inverter G46 for receiving the signal of the node Nd2, and outputting the inverted signal to a node Nd3; a clock inverter G47 for receiving the signal of the node Nd3, inverting the signal according to the output signal from the NAND gate G42 and the output signal from the inverter G43, and outputting the inverted signal to the node Nd2; a clock inverter G48 for receiving a signal of a node Nd3, inverting the signal according to the output signal from the NAND gate G42 and the output signal from the inverter G43, and outputting the inverted signal to a node Nd4; an inverter G49 for receiving the signal of the node Nd4, and outputting the inverted signal to the node Nd1; a clock inverter G50 for receiving the signal of the node Nd1, inverting the signal according to the output signal from the NAND gate G42 and the output signal from the inverter G43, and outputting the inverted signal to the node Nd4; a NAND gate G51 for receiving the signal of the node Nd1 and the input signal RCAB; an inverter G52 for receiving the output signal from the NAND gate G51, and outputting the inverted signal RCAa; and an inverter G53 for receiving the signal of the node Nd3, and outputting the inverted signal RAaB.

The operation of the circuit for generating the internal address in accordance with the present invention will now be described with reference to the waveform diagrams of FIGS. 12 to 14.

Figure 12:
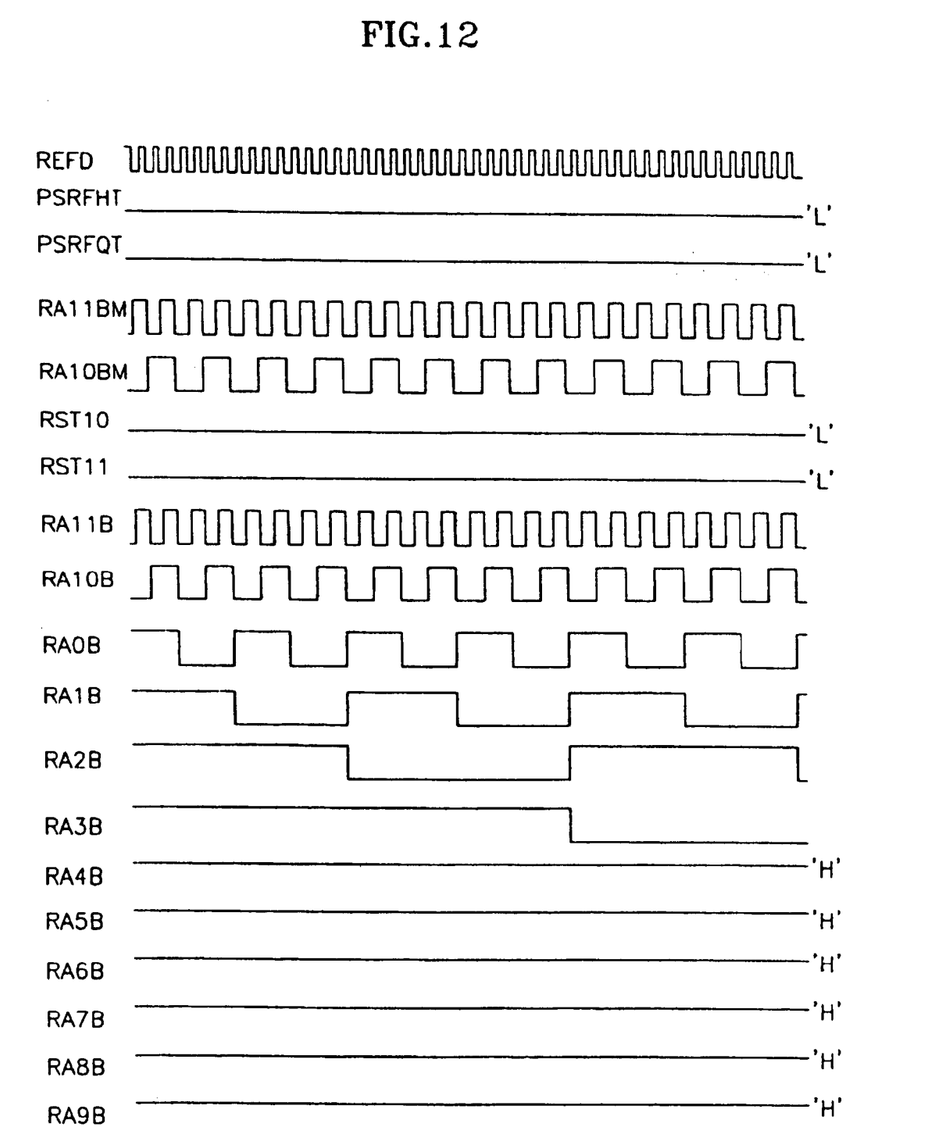
FIG. 12 is a waveform diagram illustrating an internal address in a one bank self-refresh in accordance with the present invention.

FIG. 12 is a waveform diagram illustrating the internal address in a one bank self-refresh in accordance with the present invention. In a one bank self-refresh, the control signal PSRFHT initiating the half bank operation and the control signal PSRFQT initiating the quarter bank operation are in a low state. Accordingly, the most significant address signal RA11B and the address signal RA10B are outputted in the same logic state as the output signal RA11BM from the 12th binary counter unit C22 and the output signal RA10BM from the 11th binary counter unit C21. It is thus possible to designate word lines 0 to 4095. As shown in FIG. 12, the output signal RA11BM has a period twice that of the refresh signal REFD.

Figure 13:
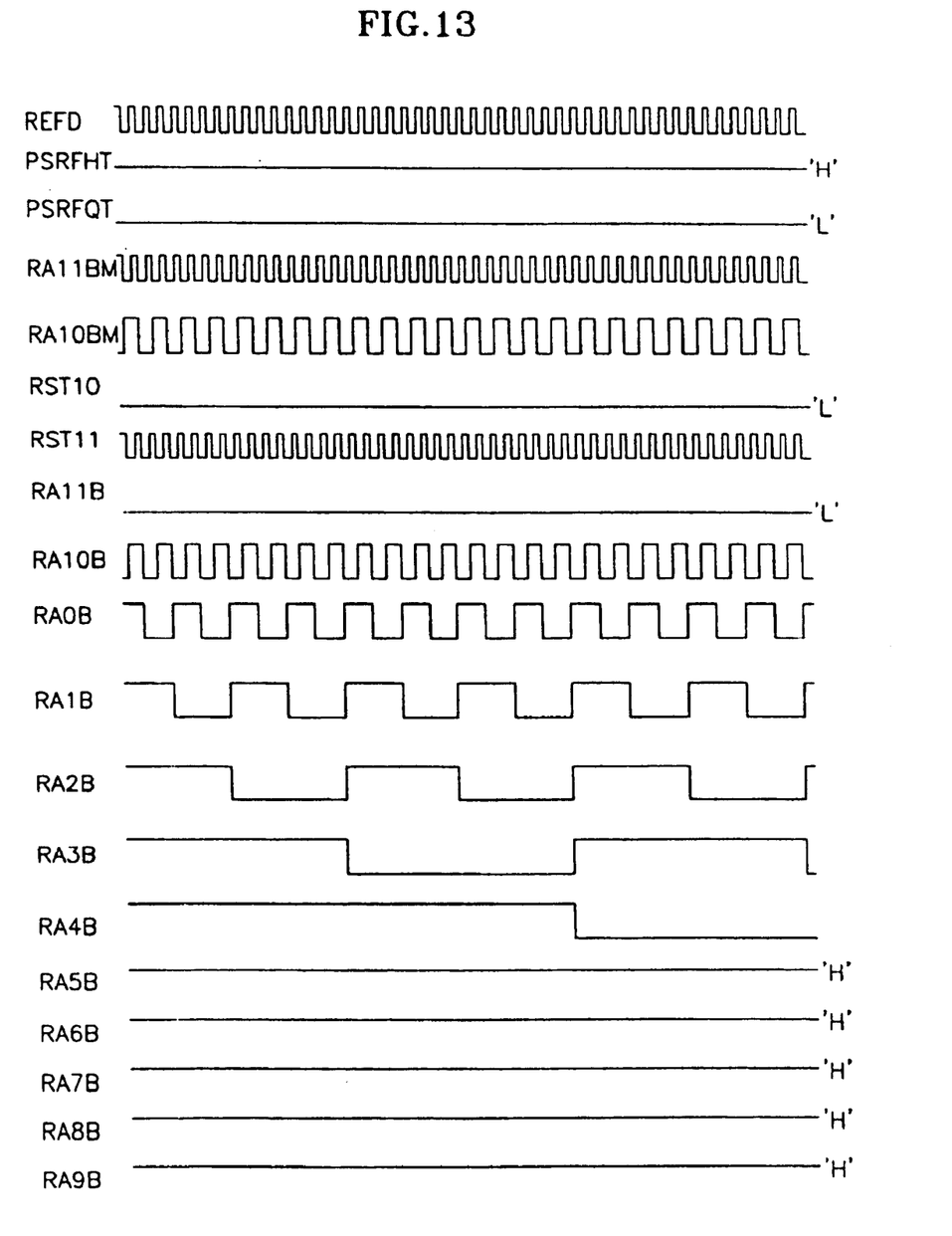
FIG. 13 is a waveform diagram illustrating the internal address in a half bank self-refresh in accordance with the present invention.

FIG. 13 is a waveform diagram illustrating the internal address in a half bank self-refresh in accordance with the present invention. In the half bank self-refresh, the control signal PSRFHT has a high level and the control signal PSRFQT has a low level. Accordingly, the address signal RA11B is maintained at a low level regardless of the input, and the address signal RA10B is outputted in the same logic state as the output signal RA10BM. It is thus possible to designate word lines 0 to 2047.

The refresh setting signal RST10 always has a low level, and the refresh setting signal RST11 has the same output value as the refresh signal REFD. When the refresh setting signal RST11 has a high level, the output signal RCAa from the 12th binary counter unit C22 of FIG. 10 has a high value. The input signal RCAB of the 11th binary counter unit C21 connected to the succeeding terminal has a high level according to the output signal RCAa. As depicted in FIG. 13, the output signal RA10BM has a period twice that of the refresh signal REFD.

Figure 14:
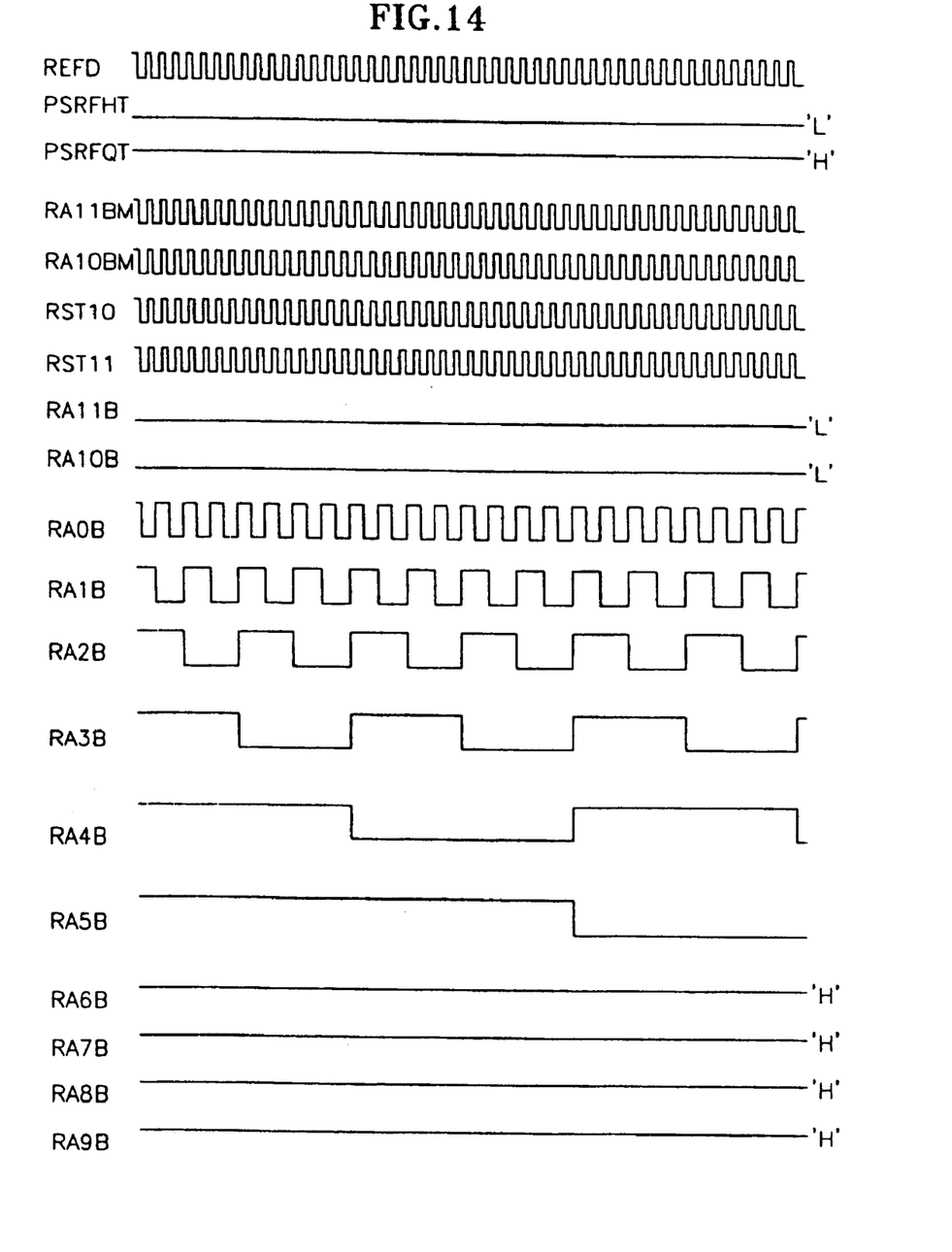
FIG. 14 is a waveform diagram illustrating the internal address in a quarter bank self-refresh in accordance with the present invention.

FIG. 14 is a waveform diagram illustrating the internal address in a quarter bank self-refresh in accordance with the present invention. In the quarter bank self-refresh, the control signal PSRFHT has a low level and the control signal PSRFQT has a high level. Accordingly, the address signal RA11B and the address signal RA10B are outputted at a low level regardless of the input. It is thus possible to designate word lines 0 to 1023.

The refresh setting signal RST10 and the refresh setting signal RST11 have the same output value as the refresh signal REFD. When the refresh setting signals RST10 and RST11 have a high level, the output signal RCAa from the 11th and 12th binary counter units C21 and C22 has a high value. As illustrated in FIG. 14, the address signal RA0B has a period twice that of the refresh signal REFD.

FIGS. 12 to 14 show the self-refresh mode where the self-refresh signal SRF has a high level. In the auto refresh where the self-refresh signal SRF has a low level, the NAND gates G2 and G7 prevent input of the control signal PSRFHT and the control signal PSRFQT, thus outputting the same waveform as FIG. 12.

As discussed earlier, in accordance with the present invention, the circuit for generating the internal address in the semiconductor memory device sequentially outputs the addresses of the word lines in the corresponding region to perform a partial array self-refresh operation for refreshing a partial region in a low power DRAM, rather than a whole bank.

In the conventional art, the whole bank (4096 word lines in the 128M DRAM) should be self-refreshed for a predetermined time (64 ms in the 128M DRAM). However, in accordance with the present invention, the addresses of the word lines in the self-refresh region (for example, 2048 or 1024 word lines) set up according to the external command can be sequentially outputted to support the low power DRAM.

As a result, the circuit for generating the internal address supports the partial array self-refresh function in the low power DRAM, and reduces power consumption of the memory in the self-refresh mode.

As the present invention may be embodied in several forms without departing from the spirit or essential characteristics thereof, it should also be understood that the above-described embodiment is not limited by any of the details of the foregoing description, unless otherwise specified, but rather should be construed broadly within its spirit and scope as defined in the appended claims, and therefore all changes and modifications that fall within the metes and bounds of the claims, or equivalences of such metes and bounds are intended to be embraced by the appended claims.

What is claimed is:

1. A circuit for generating an internal address in a semiconductor memory device, comprising:

a counter unit having a plurality of binary counters for generating internal address signals for wholly or partially refreshing word lines of a bank according to a setup value of a memory; and a control unit for receiving a most significant signal and a second most significant signal of the counter unit, a first select signal and a second select signal for deciding a word line region of the bank to be activated, said first select signal for selecting a self-refresh of a half region of the bank, and a self-refresh signal and a refresh signal, and generating a signal for controlling the operation of the counter unit, a most significant internal address signal, and a second most significant internal address signal, so that the output from the binary counters can be synchronized with the refresh signal and toggled, or fixed at a low level according to the received signals.

2. The circuit according to claim 1, wherein the counter unit comprises:

an M-th counter unit for receiving the refresh signal, the control signal from the control unit and a power voltage, and generating the sequentially-increased most significant internal address signal and a counter output signal;

an M-1th counter unit for receiving the refresh signal, the control signal from the control unit, and the counter output signal from the 12th counter unit, and generating the second most significant internal address signal and a counter output signal; and first to M-2th counter units for respectively receiving the refresh signal and the counter output signal from preceding counter units, and generating the internal address signal and counter output signal.

3. The circuit according to claim 2, wherein the M-1th and M-th counter units are binary counters for sequentially increasing output signals.

4. The circuit according to claim 2, wherein the first to M-2th counter units are binary counters for sequentially decreasing output signals.

5. The circuit according to claim 2, wherein the period of the refresh signal is greater by a factor of 2N when the address output signals of the first to M-th counter units are fixed at a low level than when the address output signals of the first to M-th counter units are not fixed at a low level where N is the number of the address output signals fixed at a low level.

6. The circuit according to claim 1, wherein the second select signal is a signal for selecting a self-refresh of a quarter region of the bank.

7. A circuit for generating an internal address in a semiconductor memory device, comprising:

a counter unit having a plurality of binary counters for generating internal address signals for wholly or partially refreshing word lines of a bank according to a setup value of a memory; and a control unit for receiving a most significant signal and a second most significant signal of the counter unit, a first select signal and a second select signal for deciding a word line region of the bank to be activated, and a self-refresh signal and a refresh signal, and generating a signal for controlling the operation of the counter unit, a most significant internal address signal, and a second most significant internal address signal, so that the output from the binary counters can be synchronized with the refresh signal and toggled, or fixed at a low level according to the received signals;

said counter unit including, an M-th counter unit for receiving the refresh signal, the control signal from the control unit and a power voltage, and generating the sequentially-increased most significant internal address signal and a counter output signal;

an M-1th counter unit for receiving the refresh signal, the control signal from the control unit, and the counter output signal from the 12th counter unit, and generating the second most significant internal address signal and a counter output signal; and first to M-2th counter units for respectively receiving the refresh signal and the counter output signal from preceding counter units, and generating the internal address signal and counter output signal.

8. The circuit according to claim 7, wherein the second select signal is a signal for selecting a self-refresh of a quarter region of the bank.

9. The circuit according to claim 7, wherein the M-1th and M-th counter units are binary counters for sequentially increasing output signals.

10. The circuit according to claim 7, wherein the first to M-2th counter units are binary counters for sequentially decreasing output signals.

11. The circuit according to claim 7, wherein the period of the refresh signal is greater by a factor of 2N when the address output signals of the first to M-th counter units are fixed at a low level than when the address output signals of the first to M-th counter units are not fixed at a low level wherein N is the number of the address output signals fixed at a low level.

12. The circuit according to claim 7, wherein the first select signal is a signal for selecting a self-refresh of a half region of the bank.

* * * * *